United States Patent [19]

Long

[11] 4,158,767
[45] Jun. 19, 1979

[54] PROGRAMMABLE BINARY COUNTER

[75] Inventor: James R. Long, Huntsville, Ala.

[73] Assignee: Avco Corporation, Huntsville, Ala.

[21] Appl. No.: 898,904

[22] Filed: Apr. 24, 1978

[51] Int. Cl.² ............................................ H03K 21/36
[52] U.S. Cl. ........................ 235/92 PE; 235/92 CM; 235/92 SA; 235/92 PL; 235/92 R; 328/48
[58] Field of Search ........ 235/92 PE, 92 CM, 92 PL, 235/92 SA; 328/48; 307/225 R

[56] References Cited

U.S. PATENT DOCUMENTS 3,145,293  8/1964  Homan ........................... 235/92 CM
3,696,236  10/1972  Kus ................................ 235/92 CM Primary Examiner—Joseph M. Thesz
Attorney, Agent, or Firm—Robert J. McNair, Jr.; Irwin P. Garfinkle

[57] ABSTRACT

This invention concerns a programmable counter which can be preset to provide an output indication one pulse after the count of the incoming signal pulse train has reached the integer M, where M equals any binary real number over the range (0, 1, 2, 4, 8, 16, . . ., 32,768). The programmable counter can be preset to any one of the binary numbers using a 4 digit word.

6 Claims, 1 Drawing Figure

4,158,767

PROGRAMMABLE BINARY COUNTER

BACKGROUND OF THE INVENTION

Programmable counters have been in use for many years. With most prior art units it takes 16 programming bits to insert a preset word into a 16-bit digital counter. In other prior art units a Read—Only—Memory is used. The former has the disadvantage of requiring an N+1 bit data word for programming $2^N$ steps while the latter method is not economical for low volume applications due to the requirement for a customized Read—Only—Memory. My invention utilizes standard medium scale integrated circuit logic modules to implement the system. With my invention, the number of programming bits required to preset the counter circuitry is reduced from N+1 bits to the number of bits required to represent the number N in binary form.

Possible applications include its use in a peripheral controller such as those used in Rotary Machinery Analysis Systems. There time-domain data is often converted to frequency-domain data. This requires that the block size of the data samples be taken in time increments having a $2^N$ binary relationship.

SUMMARY OF THE INVENTION

The object of this invention is to provide an improved programmable binary counter. The programmable counter may be preset to any one of N+1 steps of $2^N$ counts using the number of data bits, P, required to represent the number N in binary form (where N is a positive real integer = 0, 1, 2, .... i). After $2^N$ events have been counted, a logical output is created by the circuit to indicate that the programmed number of events have been counted.

The unique feature of this invention includes the method employed to convert the data bits, P, into a data word, W, consisting of N+1 data bits which is suitable to allow the binary counter to be preset to count $2^N$ events before issuing a logical output. The algorithm defining this conversion may be stated as follows:

$$W=\overline{(2^N)}+1$$

where:

W = the two's complement of the number of events ($2^N$) to be counted.

N = the power to which the number 2 is raised in determining the number of events to be counted.

In an exemplary implementation of my invention, a system is presented for the case where the maximum value of N is 16. A 4-bit binary input word serves to define a maximum value of N=16. The four input lines serve as the input to two binary coded decimal to decimal decoder integrated circuit modules each having an A, B, C, D input. The output pins from these two decoder modules will have thereon the 16 discreet states of:

$$X=\overline{2^N}$$

where the possible N values range from 0 to 15. As implemented, for any 4-bit binary input word, the output from the decoder modules will consist of 15 "ones" and one "zero", the "zero" representing the value of the 4-bit binary word encoded on the input lines.

The 16($\overline{X} = \overline{2^N}$) output lines are made the $A_i$ inputs of four serially connected 4-bit full adders. The $B_i$ inputs of the four 4-bit adders are all preset at the "zero" logic state condition. As a result the sum output pins of the four 4-bit full adders contain information representing the complement of the encoded binary word, $2^N$, plus one bit, which was previously set forth as $$W=\overline{2^N}+1$$

The sixteen sum lines coming from the four 4-bit full adders contain information which is used to preset a 16-stage counter with the complement plus one bit, of the selected 4-bit binary word chosen as the system input. With the word complement preset in the counter, clock pulses are counted into counter stage just adequate to fill its registers. The clock pulse arriving next after the registers are full causes the counter stages to overflow. The overflow condition triggers a flip-flop. This triggering of a flip-flop serves as an indication that the time interval needed to count in $2^N+1$ pulses has elapsed.

Reprogramming of the binary counter is normally accomplished after the previous count sequence is completed. Due to the ability of the counter circuits utilized to be asychronously preset, the counter may be reinitialized at any time, even when a count sequence is in progress. Assertion of the $\overline{\text{PRESET COUNT}}$ input inhibits the COUNT INPUT signal, preventing the counters from advancing while the preset function is occurring, and resets the flip-flop to a non-asserted state. This causes the circuit to be reinitialized to a new count value. The counter will start counting on the first zero-to-one transition on the COUNT INPUT after the $\overline{\text{PRESET COUNT}}$ input is returned to its non-asserted state.

IN THE DRAWINGS

FIG. 1 is a schematic diagram of the programmable binary counter showing pin numbers of the integrated circuit modules.

DESCRIPTION OF THE PREFERRED EMBODIMENT

Figure 1:
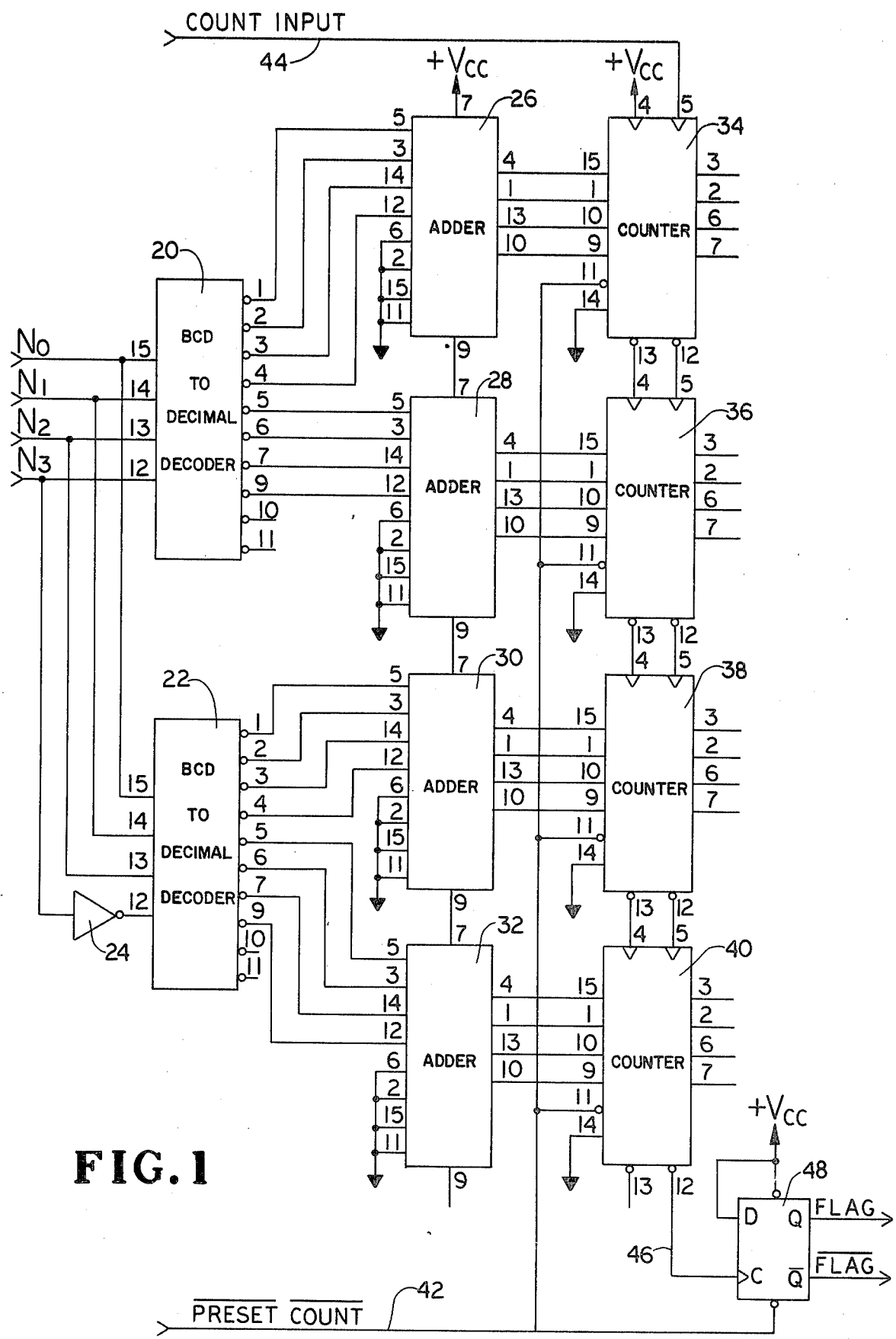

Implementation of the programmable counter is typified by, but not restricted to, the circuit of FIG. 1. As implemented therein, my invention utilizes standard TTL integrated logic circuits.

The circuit shown is programmable in 16 ways of $2^N$ size, where N=0,1,2,3,4,....,15, and covers a range of 1 count to 32,768 counts. Only 4 programming data-bits $N_0, N_1, N_2,$ and $N_3$, are required since the number=15 is represented by 4 binary digits.

Referring to FIG. 1, the data bits $N_0, N_1, N_2,$ and $N_3$, are first decoded by a one-of-sixteen line decoder, consisting of integrated circuit modules 20, 22 and 24, into the one's complement representation of the binary number $X=\overline{2^N}=\overline{2^0, 2^1,....2^{15}}$. Module 20 is a 4-bit Binary-Coded-Decimal-to-Decimal decoder that is connected as an octal (or one-of-eight) decoder. In the system reduced to practice decoder modules 20 and 22 were type 7442A MSI circuits. As implemented, module 20 will assert one output (0,1,2,......7) that corresponds to the binary number present on its input lines 15, 14 and 13, if input on line 12 is not asserted. Module 20 therefore forms the one's complement of $X=\overline{2^N}=\overline{2^0,2^1......2^7}$.

The Binary-Coded-Decimal-to-Decimal Decoder, Module 22, is also connected as an octal decoder. This module will assert one output which corresponds to the binary number ($N_0$, $N_1$ and $N_2$) present on its input, lines 15, 14 and 13, if its input line 12 is not asserted. The binary bit $N_3$ is inverted in Inverter Module 24 (A type 7404 integrated circuit in the unit reduced to practice). The inverter causes module 22 to be inhibited when $N_3$ equals 0 and enabled when $N_3$ equals 1, so that the output of inverter 24 will be asserted for values of N=8, 9, .....15, and inhibited for values of N=0, 1,1, 2, .....7. In combination then modules 20, 22 and 24, when encircuited as shown in FIG. 1, produce the output code sequence presented in Table A.

TABLE A

| Inputs | | | | | Output - Module 20 | | | | | | | | Output - Module 22 | | | | | | | |
|---|---|---|---|---|---|---|---|---|---|---|---|---|---|---|---|---|---|---|---|---|
| $N_0$ | $N_1$ | $N_2$ | $N_3$ | No. | 1 | 2 | 3 | 4 | 5 | 6 | 7 | 9 | 1 | 2 | 3 | 4 | 5 | 6 | 7 | 9 |
| 0 | 0 | 0 | 0 | 0 | 0 | 1 | 1 | 1 | 1 | 1 | 1 | 1 | 1 | 1 | 1 | 1 | 1 | 1 | 1 | 1 |
| 1 | 0 | 0 | 0 | 1 | 1 | 0 | 1 | 1 | 1 | 1 | 1 | 1 | 1 | 1 | 1 | 1 | 1 | 1 | 1 | 1 |
| 0 | 1 | 0 | 0 | 2 | 1 | 1 | 0 | 1 | 1 | 1 | 1 | 1 | 1 | 1 | 1 | 1 | 1 | 1 | 1 | 1 |
| 1 | 1 | 0 | 0 | 3 | 1 | 1 | 1 | 0 | 1 | 1 | 1 | 1 | 1 | 1 | 1 | 1 | 1 | 1 | 1 | 1 |
| 0 | 0 | 1 | 0 | 4 | 1 | 1 | 1 | 1 | 0 | 1 | 1 | 1 | 1 | 1 | 1 | 1 | 1 | 1 | 1 | 1 |
| 1 | 0 | 1 | 0 | 5 | 1 | 1 | 1 | 1 | 1 | 0 | 1 | 1 | 1 | 1 | 1 | 1 | 1 | 1 | 1 | 1 |
| 0 | 1 | 1 | 0 | 6 | 1 | 1 | 1 | 1 | 1 | 1 | 0 | 1 | 1 | 1 | 1 | 1 | 1 | 1 | 1 | 1 |
| 1 | 1 | 1 | 0 | 7 | 1 | 1 | 1 | 1 | 1 | 1 | 1 | 0 | 1 | 1 | 1 | 1 | 1 | 1 | 1 | 1 |
| 0 | 0 | 0 | 1 | 8 | 1 | 1 | 1 | 1 | 1 | 1 | 1 | 1 | 0 | 1 | 1 | 1 | 1 | 1 | 1 | 1 |
| 1 | 0 | 0 | 1 | 9 | 1 | 1 | 1 | 1 | 1 | 1 | 1 | 1 | 1 | 0 | 1 | 1 | 1 | 1 | 1 | 1 |
| 0 | 1 | 0 | 1 | 10 | 1 | 1 | 1 | 1 | 1 | 1 | 1 | 1 | 1 | 1 | 0 | 1 | 1 | 1 | 1 | 1 |
| 1 | 1 | 0 | 1 | 11 | 1 | 1 | 1 | 1 | 1 | 1 | 1 | 1 | 1 | 1 | 1 | 0 | 1 | 1 | 1 | 1 |
| 0 | 0 | 1 | 1 | 12 | 1 | 1 | 1 | 1 | 1 | 1 | 1 | 1 | 1 | 1 | 1 | 1 | 0 | 1 | 1 | 1 |
| 1 | 0 | 1 | 1 | 13 | 1 | 1 | 1 | 1 | 1 | 1 | 1 | 1 | 1 | 1 | 1 | 1 | 1 | 0 | 1 | 1 |
| 0 | 1 | 1 | 1 | 14 | 1 | 1 | 1 | 1 | 1 | 1 | 1 | 1 | 1 | 1 | 1 | 1 | 1 | 1 | 0 | 1 |
| 1 | 1 | 1 | 1 | 15 | 1 | 1 | 1 | 1 | 1 | 1 | 1 | 1 | 1 | 1 | 1 | 1 | 1 | 1 | 1 | 0 |

From Table A it can be seen that the logic sequence at the output of modules 20 and 22 represent the complement of the 4-bit binary coded decimal input present on lines $N_0$, $N_1$, $N_2$ and $N_3$. For example if the input on lines $N_0$,---,$N_3$ was 1,1,1,0 respectively, there would be a zero level logic output on pin 9 of module 20 and logic level ones on all other output pins of both modules 20 and 22.

The outputs of module 20 serve as inputs to integrated circuit modules 26 and 28. Similarly, the outputs of module 22 serve as inputs to integrated circuit modules 30 and 32. In the system reduced to practice, modules 26, 28, 30 and 32 were all type 74283 4-bit full adders. In each of these modules, pins 5, 3, 14 and 12 represent the $A_1$, $A_2$, $A_3$ and $A_4$ adder inputs, respectively. Pins 6, 2, 15 and 11 represent the $B_1$, $B_2$, $B_3$ and $B_4$ adder inputs, respectively. Pin 7 is the "carry in" bit and pin 9 is the "carry out" bit. Pins 4, 1, 13 and 10 represent the $S_1$, $S_2$, $S_3$ and $S_4$ sum output of $A_1 + B_1$, etc.

As encircuited, all the $B_i$ inputs are wired to logic ground which is equivalent to logic zero and the "carry in" input of module 26 is connected to the logic power supply, Vcc, which is equivalent to the logic "one" state. The result is the following Truth Table for each of the 4-bit full adder modules 26, 28, 30 and 32.

| Truth Table | | | | |
|---|---|---|---|---|
| $A_i$ | $B_i$ | $C_i$ | $C_o$ | Sum |
| 0 | 0 | 1 | 0 | 1 |
| 1 | 0 | 1 | 1 | 0 |
| 0 | 0 | 0 | 0 | 0 |
| 1 | 0 | 0 | 0 | 1 |

Referring to the Truth Table and to Table A, it can be seen that three situations pertain. The outputs from modules 20 and 22 consist of fifteen "ones" and a single "zero". The location of the "zero" corresponds to the value of the input 4-bit binary word. For example, if the input number is a 6, then the output on pin 7 of module 20 is a "zero" and all other outputs from both modules 20 and 22 are "ones". This means that the $A_i$ inputs to adder 26 are all "ones" and the $B_i$ inputs are all "zeros". Referring to the Truth Table, it is seen that the sum outputs for pins 4, 1, 13 and 10 will all be "zeros" and the "carry outs" will be "ones".

For the example chosen, wherein pin 7 of module 20 has a "zero" output, the $A_3$ input on pin 14 of adder 28 will contain a "zero". Referring to the Truth Table, it is seen that for this condition, the sum output will be a "one" and the "carry output" will be a "zero" since there will have been a "one" on the "carry input" passed forward from the preceeding adder stages. Subsequent adder stages in adders 28, 30 and 32 will all contain "ones" on the sum output since all of the $A_i$ inputs will be "ones", the $B_i$ inputs will be "zeros", the "carry input" will be "zero" and the "carry output" will be "zero". What we have then at the sum output pins of adders 26, 28, 30 and 32 are "zeros" down to the position of the "zero" output from modules 20 and 22. Whenever that location is reached, that corresponding sum output and all subsequent sum outputs will be "ones".

In binary nomenclature terms, the value of the digital sequence present at the sum outputs of the 4-bit full adders 26, 28, 30 and 32, when read from top to bottom, equals one bit more than the complement of the selected 4-bit binary coded input present on lines $N_0$, $N_1$, $N_2$ and $N_3$. For the example where the input number was 6 (an N sequence of 0-1-1-0), the totalled sum output from adders 26, 28, 30 and 32 would represent the binary number $W = (65,535 - 64) + 1$.

The binary sequence on the sum outputs of adders 26, 28, 30 and 32 is loaded into presettable binary counters 34, 36, 38 and 40 which are encircuited as shown in FIG. 1. In the system reduced to practice the four presettable counters were type 74193 integrated circuit modules. Pins 15, 1, 10 and 9 represent the data A, B, C and D inputs to the presettable counter while pin 11 is the "load", pin 14 is the "clear", pin 5 is the "count up", pin 4 is the "count down", pin 13 is the "borrow" and pin 12 is the "carry".

Functionally, the binary sequence present on the sum outputs of the four adders 26, 28, 30 and 32 is loaded into the "data" inputs of the presettable counters by means of "load" pulse introduced via line 42. "Zero" reset is biased to a zero logic level at pin 14 of each counter module. Each time the "load" pulse is introduced, the counters are all preset to the binary value present on the "data" inputs (Pins 15, 1, 10 and 9 of counter 34, et seq.). With the new word loaded in the counters and the "load" logic interval completed, the logic level on line 42 drops back to the "zero" level and counting of pulses present on line 44 commences.

When the count input gets within one bit of the value $2^N$ inserted on the $N_0$, $N_1$, $N_2$ and $N_3$ lines, the registers in the four adders will be full. One more pulse entered along line 44 will cause the registers to overflow, creating a carry output pulse on pin 12 of adder 40.

Line 46 is connected at its second end to the clock input of D-type flip-flop 48. In the unit reduced to practice flip-flop 48 was a type 7474 integrated circuit module. Flip-flop 48 is shown in FIG. 1 as having its D-input lead wired to the same logic level "one" as is its "set" lead. The "reset" lead is encircuited in parallel with the "load" word logic. Wired in the manner shown in FIG. 1, flip-flop 48 will produce logic levels of $Q=1$, $\overline{Q}=0$ each time line 46 has a "zero to one" transition thereon and $\overline{Q}=1$, $Q=0$ for all occasions when there is a logic level "zero" on line 42.

To summarize, my invention provides an indication out of the Q output of flip-flop 48 when the count on line 44 reaches the value of 2 raised to the power, N, signified by the 4-bit binary word inserted on lines $N_0$, $N_1$, $N_2$ and $N_3$. The unit which was reduced to practice was used with a clock operating at a rate of 100,000 Hertz. This meant that from the initiation of a preset count pulse to completion of the maximum available count of 32,768 pulses takes 327.68 ms.

My invention has been described in conjunction with a 4-bit binary word input. The same concepts would apply for an expanded number of input lines, for example n=(1,2,3,4,....,19) or n=(0,1,....,23). To expand the capabilities of the system would merely require addition of more stages onto module 22, adder 32 and counter 40. Modifications will be obvious to those skilled in the art and no unnecessary limitations are to be construed from foregoing description which is given only for clearness of understanding.

I claim:

1. A programmable counter for giving an output indication after the count of the incoming signal pulse train has reached a preselected binary real number $2^N$ where N is any positive integer (0, 1, 2, 3, ....., i) said counter comprising:

means for receiving an instruction designating said binary real number $2^N$, said instruction using no more than the number of data bits required to represent the maximum selectable value of N;

a decoder encircuited with and responsive to the instruction receiving means, said decoder having as many parallel output lines as there are programmable values of N in said instructions, said decoder providing on said output lines electrical potentials representative in binary terminology, the one's complement of said programmed binary number $2^N$;

adder means having an input connected to the output lines of said decoder, said adder means being encircuited to provide an output consisting of electrical potentials representing in binary terminology a logic sequence which is one numerical unit more than the complement of said preselected binary real number;

a multistage presettable binary counter having a clock line input for accepting counting pulses from an external source, said counter having binary register capacity adequate to store the maximum value of said preselected binary real number $2^N$, said counter including an output line carrying an electrical potential which switches from the binary zero logic level to the binary one logic level whenever the registers of said binary counter reach the overflow condition;

circuit means for first, presetting all registers of said counter with the binary word sample present on the output lines of said adder means, and second, subsequent to the new word being loaded into counter, restoring the presettable counter to the state whereby clock pulse counting can begin; and means coupled to the output line of said presettable binary counter for providing an indication that said counter has reached the overflow condition.

2. The invention as defined in claim 1 wherein the value of N is any positive real integer in the range 0, 1, 2, 3, ...,15.

3. The invention as defined in claim 2 wherein the decoder comprises two 4-bit binary-coded-decimal-to-decimal decoders operating in parallel, each connected as an octal (or one-of-eight) decoder.

4. The invention as defined in claim 2 wherein the adder means comprises four 4-bit full adders encircuited in parallel.

5. The invention as defined in claim 2 wherein the multistage presettable binary counter includes four presettable binary up/down counter modules each having four data inputs and connections for the following signals, Count Up, Count Down, Borrow, Carry, Clear and Load.

6. The invention as defined in claim 1 wherein the means coupled to the output line of said presettable binary counter includes a D-type flip-flop encircuited to produce logic levels of $Q=1$, $\overline{Q}=0$ at the output each time the Clock-input has a logic level transition "zero to one" thereon and $Q=0$, $\overline{Q}=1$ for all occasions when there is a logic level "zero" on the Reset-input line.

* * * * *